United States Patent
Lee et al.

(10) Patent No.: US 10,010,912 B2
(45) Date of Patent: Jul. 3, 2018

(54) PARTICLE REDUCTION VIA THROTTLE GATE VALVE PURGE

(71) Applicant: APPLIED MATERIALS, INC., Santa Clara, CA (US)

(72) Inventors: Jared Ahmad Lee, Santa Clara, CA (US); Dmitry Lubomirsky, Cupertino, CA (US); Martin Jeff Salinas, Livermore, CA (US); Andrew Nguyen, San Jose, CA (US); Tom K. Cho, Los Altos, CA (US); Eric A. Englhardt, Palo Alto, CA (US); Fernando Silveira, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 266 days.

(21) Appl. No.: 14/276,289

(22) Filed: May 13, 2014

(65) Prior Publication Data

US 2014/0366953 A1    Dec. 18, 2014

Related U.S. Application Data

(60) Provisional application No. 61/834,928, filed on Jun. 14, 2013.

(51) Int. Cl.
*F16K 51/02* (2006.01)
*B08B 9/032* (2006.01)
(Continued)

(52) U.S. Cl.
CPC .............. *B08B 9/0325* (2013.01); *F16K 3/02* (2013.01); *F16K 51/02* (2013.01);
(Continued)

(58) Field of Classification Search
CPC ......... B08B 9/0325; F16K 51/02; F16K 3/02; H01L 21/67253; H01L 21/67017; Y10T 137/0419; Y10T 137/4259
(Continued)

(56) References Cited

U.S. PATENT DOCUMENTS 2,001,271 A * 5/1935 Smith ........................ F16K 3/30
137/240
2,315,058 A * 3/1943 Holt ........................ F16K 5/162
137/240
(Continued)

FOREIGN PATENT DOCUMENTS

KR     20100064159 A *  6/2010
KR     20120103170 A *  9/2012

OTHER PUBLICATIONS

NPL #1—Machine Translation of KR101201817 as supplied by KIPO which is an equivalent to KR 10-2012-0103170 which was submitted on the IDS filed on Oct. 2, 2014.*
(Continued)

*Primary Examiner* — Kevin Murphy
(74) *Attorney, Agent, or Firm* — Moser Taboada; Alan Taboada

(57) ABSTRACT

Methods and apparatus for particle reduction in throttle gate valves used in substrate process chambers are provided herein. In some embodiments, a gate valve for use in a process chamber includes a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; and a plurality of gas ports disposed in the gate valve configured
(Continued)

to direct a gas flow into a portion of the gate valve fluidly coupled to the opening.

20 Claims, 3 Drawing Sheets

(51) Int. Cl.
  *F16K 3/02* (2006.01)
  *H01L 21/67* (2006.01)
(52) U.S. Cl.
  CPC .. *H01L 21/67017* (2013.01); *H01L 21/67253* (2013.01); *Y10T 137/0419* (2015.04); *Y10T 137/4259* (2015.04)
(58) Field of Classification Search
  USPC ........ 251/193, 326, 300, 301; 137/240, 238, 137/15.05
  See application file for complete search history.

(56) References Cited

U.S. PATENT DOCUMENTS

| | | | | |
|---|---|---|---|---|
| 3,918,471 | A * | 11/1975 | Bedner | F16K 3/02 137/238 |
| 4,153,069 | A * | 5/1979 | Frechou | F16K 3/0281 137/238 |
| 4,402,337 | A * | 9/1983 | Schuurman | F16K 3/20 137/240 |
| 4,535,801 | A * | 8/1985 | Neale | F16K 3/0227 134/166 C |
| 6,364,959 | B1 * | 4/2002 | Straub | B65G 45/22 100/151 |
| 7,585,370 | B2 | 9/2009 | Gochberg et al. | |
| 7,754,014 | B2 | 7/2010 | Gochberg et al. | |
| 2003/0131885 | A1 * | 7/2003 | Birtcher | B67D 7/0272 137/240 |
| 2010/0022093 | A1 * | 1/2010 | Yamaguchi | H01L 21/67196 438/706 |
| 2010/0282710 | A1 | 11/2010 | Kitamura et al. | |
| 2010/0327203 | A1 | 12/2010 | Nagai et al. | |
| 2013/0263895 | A1 * | 10/2013 | Lee | C23C 16/4407 134/22.1 |
| 2014/0003892 | A1 | 1/2014 | Yamamoto et al. | |

OTHER PUBLICATIONS

International Search Report and Written Opinion dated Sep. 17, 2014 for PCT Application No. PCT/US2014/037869.

* cited by examiner

PARTICLE REDUCTION VIA THROTTLE GATE VALVE PURGE

CROSS-REFERENCE TO RELATED APPLICATIONS

This application claims benefit of U.S. provisional patent application Ser. No. 61/834,928, filed Jun. 14, 2014, which is herein incorporated by reference.

FIELD

Embodiments of the present invention generally relate to substrate processing equipment.

BACKGROUND

Within substrate processing equipment, a gate valve may be utilized, for example, to control pressure within a process chamber and/or to control the flow of reactive species, process gases, byproducts from a process, or the like from a processing volume of the process chamber. Gate valves typically include a gate disposed in a gate valve body that is selectively movable between two positions—a closed position where the gate seals an opening in the gate valve and an open position where gases may flow through the opening in the gate valve. A throttling gate valve can move to any position between the open and closed positions. Unfortunately, however, such gases can undesirably flow into a recess of the gate valve body where the gate is disposed when in an at least partially open position and may deposit particulate matter in the recess of the valve body or on the gate. Such deposits can undesirably break free, for example, by a pressure change in the process chamber, by vibration due to operation of the gate valve, or the like, which can lead to undesirable contamination of a substrate being processed in the chamber.

The inventors have observed that conventional methods of limiting contamination and deposits on portions of gate valve bodies are inadequate to provide the reduced level of contaminants required by some processes.

Accordingly, the inventors have provided an improved gate valve.

SUMMARY

Methods and apparatus for particle reduction in throttle gate valves used in substrate process chambers are provided herein. In some embodiments, a gate valve for use in a process chamber includes a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; and a plurality of gas ports disposed in the gate valve configured to direct a gas flow into a portion of the gate valve fluidly coupled to the opening.

In some embodiments, a gate valve for use in a process chamber includes a body having an opening disposed therethrough from a first surface to an opposing second surface of the body; a pocket extending into the body from a sidewall of the opening; a gate movably disposed within the pocket between a closed position that seals the opening and an open position that reveals the opening and disposes the gate completely within the pocket; a plurality of gas ports disposed in the pocket configured to direct a gas flow into a portion of the gate valve fluidly coupled to the opening; and one or more valves coupled to the gas ports to selectively open or close the gas ports.

In some embodiments, methods for reducing particle contamination in a process chamber include performing a process in a process chamber that generates a process byproduct to be removed from an inner volume of the process chamber; flowing the process byproduct from the inner volume through an opening of a gate valve coupled to the process chamber to remove the process byproduct from the inner volume in a waste stream; and flowing a gas through the opening and into the waste stream via one or more gas ports disposed in a body of the gate valve and fluidly coupled to the opening.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
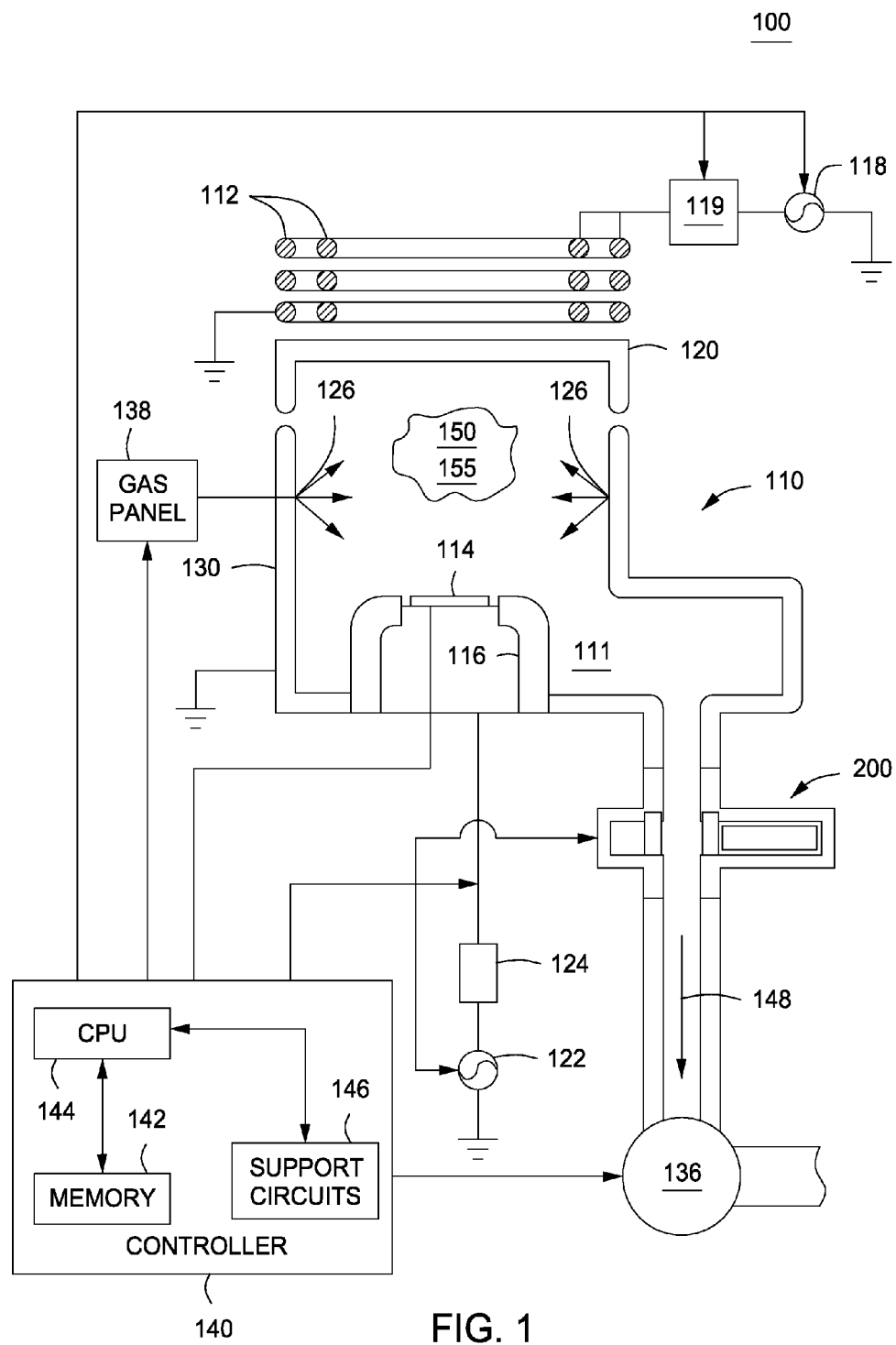
FIG. 1 depicts a schematic side view of an etch reactor having a gate valve coupled thereto in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of gate valves and methods for using same are provided herein. The disclosed gate valves and methods of using same advantageously prevent or reduce particle contamination resultant from deposition of materials on portions of the gate valve, such as may be due to deposition of process materials or byproduct, deposition of particles generated from mechanical contact between surfaces within the chamber or transported into the chamber from other sources, or the like. The disclosed apparatus and methods may advantageously prevent contaminants from re-entering the process environment upon exhaust therefrom due to deposition and subsequent flaking from gate valve components.

The disclosed gate valve may be used in any application in which a conventional gate valve may be used, for example in applications in which it is desirable or advantageous to throttle the flow of a fluid. In a non-limiting application, the disclosed gate valve may be disposed in a process chamber, such as an etch reactor or other suitable process chambers that require a gate valve. For example, FIG. 1 depicts a schematic diagram of an illustrative etch reactor 100 of the kind that may be used to practice embodiments of the invention as discussed herein. The etch reactor 100 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well, such as chambers with remote plasma sources, electron cyclotron resonance (ECR) plasma chambers, and the like. Other non-etch reactors that utilize gate valves and/or process gases that may form deposits may also be modified to advantage with the gate valve disclosed herein.

The illustrative etch reactor 100 comprises a chamber 110 (e.g., a process chamber) having a substrate support 116 (cathode) within a conductive body (wall) 130, and a controller 140. The chamber 110 may have a vacuum pump 136, for example, a turbo pump or the like, fluidly coupled to an inner volume 111 of the chamber 110 via a gate valve 200. The chamber 110 may be supplied with a substantially flat dielectric ceiling 120. Alternatively, the chamber 110 may have other types of ceilings, e.g., a dome-shaped ceiling. An antenna comprising at least one inductive coil element 112 is disposed above the ceiling 120 (two co-axial inductive coil elements 112 are shown). The inductive coil element 112 is coupled to a plasma power source 118 through a first matching network 119. The plasma power source 118 typically is capable of producing, for example, up to 3000 W at a tunable frequency in a range from 50 kHz to 13.56 MHz.

The substrate support 116 is coupled, through a second matching network 124, to a biasing power source 122. The biasing power source 122 generally is capable of producing up to 1500 W at a frequency of, for example, approximately 13.56 MHz. The biasing power may be either continuous or pulsed power. In other embodiments, the biasing power source 122 may be a DC or pulsed DC source.

The controller 140 comprises a central processing unit (CPU) 144, a memory 142, and support circuits 146 for the CPU 144 and facilitates control of the components of the chamber 110 and, as such, any etch process performed therein. The controller 140 may be one of any form of general-purpose computer processor that can be used in an industrial setting for controlling various chambers and sub-processors. The memory 142, or computer-readable medium, of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive methods described herein are generally stored in the memory 142 as a software routine. The software routine may also be stored and/or executed by a second CPU (not shown) that is remotely located from the hardware being controlled by the CPU 144.

In operation, a substrate 114 is placed on the substrate support 116 and process gases are supplied from a gas panel 138 through entry ports 126 and form a gaseous mixture 150. The gaseous mixture 150 is ignited into a plasma 155 in the chamber 110 by applying power from the plasma power source 118 and biasing power source 122 to the inductive coil element 112 and the cathode (substrate support 116), respectively. The gaseous mixture 150 and/or plasma 155 may interact with the substrate 114, for example, in a plasma etch process to remove a portion of the substrate material. The substrate material may be removed, for example, by reacting with the plasma 155 to form a gaseous byproduct which can be exhausted in a waste stream 148 (indicated by arrow) from the chamber 110 via the gate valve 200 to the vacuum pump 136.

Figure 2A:
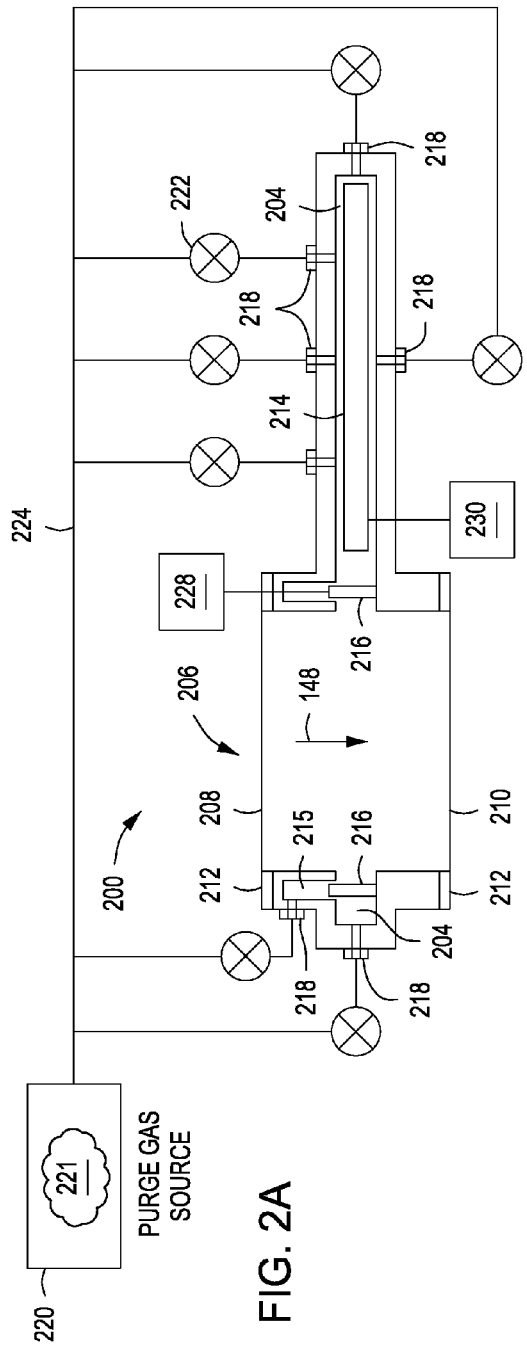
FIG. 2A depicts a schematic side view of the gate valve of FIG. 1 in an open position in accordance with some embodiments of the present invention.
Figure 2B:
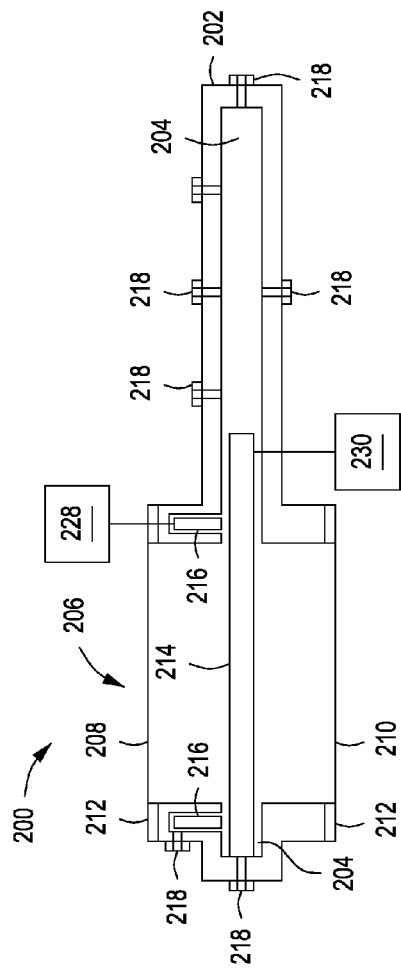
FIG. 2B depicts a schematic side view of the gate valve of FIG. 1 in a closed position in accordance with some embodiments of the present invention.

The gate valve 200 may be configured to prevent, or reduce, the deposition of the gaseous mixture 150, the plasma 155, gaseous byproducts, polymeric species, or combinations thereof, on and/or within components of the gate valve 200. FIGS. 2A and 2B depict the gate valve 200 in further detail, and illustrate the gate valve 200 in both the open (FIG. 2A) and closed (FIG. 2B) position. For ease of illustration only, certain elements, such as the purge gas source, valves, and conduits shown in FIG. 2A are omitted from the view in FIG. 2B so as not to clutter the figure.

FIG. 2A depicts a schematic side view of the gate valve 200 in accordance with some embodiments of the present invention. The gate valve 200 includes a body 202 having an opening 206 disposed through the body 202 (for example, from a first surface 208 of the body 202 to an opposing second surface 210 of the body 202). The body 202 may have any suitable shape as required for a particular application, for example, the body 202 may have a suitable shape appropriate for coupling the gate valve 200 to the chamber 110, or to another chamber, as appropriate. The gate valve 200 may further include one or more flanges 212 disposed near the first surface 208 and the second surface 210 of the body 202 proximate the opening 206. The flanges 212, for example, may be part of the body 202, or may be welded, bolted, or otherwise affixed to the body 202. The flanges 212 may be utilized to couple the gate valve 200 to the chamber 110 (on one side of the opening 206) and the vacuum pump 136 (on the other side of the opening 206). The body 202 may be fabricated from one or more process-compatible materials, including non-limiting examples such as stainless steel or aluminum.

A bonnet flange, or pocket 204, extends from a sidewall of the opening 206 and into the body 202. A pendulum plate, or gate 214, may be movably disposed within the body 202 of the gate valve 200 between two positions—within the pocket 204 and within the opening 206. For example, when the gate valve 200 is in an open position (FIG. 2A), the gate 214 is disposed completely within the pocket 204 and does not extend into the opening 206. When the gate valve 200 is in a closed position (FIG. 2B), the gate 214 is disposed within the opening 206 and substantially seals the opening 206, for example, preventing the flow of gases, plasma, byproducts, or the like between the inner volume 111 of the chamber 110 and the vacuum pump 136. The gate 214 may be any suitable shape, for example circular, that allows the gate 214 to seal the opening 206 when the gate valve 200 is in the closed position. The gate may comprise one or more suitable process-compatible materials including non-limiting examples such as stainless steel or aluminum. The gate 214 may be moved via an actuator 230, such as a linear or rotary actuator that may be coupled to the gate 214, directly, or via some other component (such as a shaft) to control the position of the gate 214 via operation of the actuator 230.

The gate valve 200 may optionally include a shutter 216 configured to selectively seal the pocket 204 when the gate valve 200 is in the fully open position (FIG. 2A). The optional shutter 216 may be any suitable shape necessary to the seal the pocket 204. For example, the shutter 216 may be an annular cylinder or similar shape that generally conforms to the shape of the opening 206. The shutter 216 may comprise one or more suitable process-compatible materials including non-limiting examples such as stainless steel or aluminum.

In some embodiments, the optional shutter 216 may be disposed within a recess 215 formed within the body 202 proximate the opening 206 when the gate valve 200 is in a closed, or partially closed, position. The shutter 216 may be movable between a first position (FIG. 2A) that seals the pocket 204 and a second position (FIG. 2B) that reveals the pocket 204 and allows the gate 214 to freely move without interference from the shutter 216. Accordingly, the shutter 216 can limit gases, plasma, byproducts or the like from depositing on the gate 214 and within the pocket 204 of the gate valve 200 when the shutter is in the first (or closed) position.

The shutter 216 may be coupled to an actuator 228 that facilitates movement (e.g., extension and retraction) of the shutter 216. Exemplary devices can include pneumatic or hydraulic actuators, or the like. In some embodiments, the actuator 228 is a pneumatic actuator.

Figure 4:
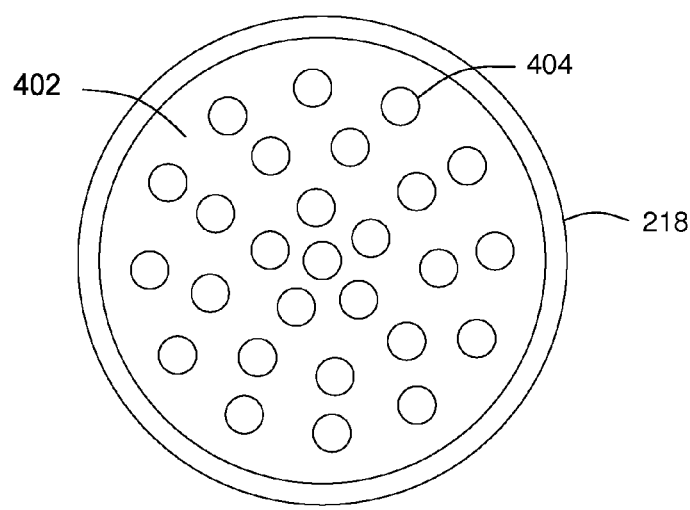
FIG. 4 depicts an illustrative end view of a gas port of a gate valve having an exemplary gas diffuser in accordance with some embodiments of the present invention.

In some embodiments, the gate valve 200 includes one or more gas ports 218 coupled at a first end to the body 202 and in fluid communication with the interior of the body 202, for example with the pocket 204 or the opening 206 or with both the pocket 204 and the opening 206. The gas ports 218 may include one or more fixed-position nozzles, in which the direction of fluid flow is fixed with respect to the body of the gas port, one or more positionable nozzles, in which the direction of fluid flow can be changed relative to the body of the port, or combinations of fixed-position and positionable nozzles. Some gas ports 218 may include a gas diffuser to advantageously increase the effective cross-sectional area of the gas flow, as compared to the cross-sectional area of the gas flow from the gas port 218 without a gas diffuser. For example, FIG. 4 depicts an illustrative end view of a gas port 218 comprising an exemplary gas diffuser 402 having a plurality of gas diffusing passages 404. The gas diffusing passages distributes the gas flow more evenly across the cross section of the gas port 218.

As illustrated in FIG. 2A, five gas ports 218 are illustratively disposed about the pocket 204, one port is disposed in a portion of the pocket 204 opposite the gate 214, and one gas port 218 is disposed in a portion of the recess 215. A greater or lesser number of gas ports 218 may be used depending on process requirements, and may be disposed in different portions of the body 202 that those illustrated in FIG. 2A.

Each gas port 218 may be fluidly coupled at a second end to a purge gas source 220 through a respective valve 222 and appropriate conduit system 224. Each valve 222 may be independently controlled to provide individualized flow conditions (e.g., individualized control of mass flow, volume flow, pressure, etc.) to each gas port 218. Accordingly, in some embodiments, one or more valves may comprise mass flow controllers, volume flow controllers, or pressure regulators. In embodiments using a purge gas, the purge gas 221 may be nitrogen ($N_2$), although other appropriate process-inert gas, including, as non-limiting examples, helium (He), argon (Ar), or the like, or mixtures of inert gases, may be used as the purge gas 221. The purge gas source 220, valves 222, and conduit system 224 has been removed from FIG. 2B for clarity.

In some embodiments, valves 222 are pneumatically controlled between at least a first position in which the valve is fully open and a second position in which the valve is fully closed. Each valve 222 may be in a fully open, a fully closed, or a partially open position to provide flow conditions to the gas ports 218 as necessary. In other embodiments, the valves 222 may be controlled between at least the first and second positions by other mechanisms, for example servo motors. In the exemplary first position, the valve 222 is fully open to allow passage of a purge gas 221 from the purge gas source 220 to the gas port 218 associated with the valve 222. In the exemplary second position, the valve 222 is fully closed to prevent passage through the valve 222, isolating the gas port 218 from the purge gas source 220. In some embodiments, the valves 222 may be continuously pulsing valves, or modulating valve, or may be configured to provide other flow conditions as necessary.

In some embodiments, the gas ports 218 may be configured to facilitate the removal of contaminants, such as gases, process byproducts, or other such species generated during processing from the pocket 204, the gate 214, or other areas of the gate valve 200 into the opening 206, so they may be included in the waste stream 148 into the vacuum pump 136. Removal of the aforementioned contaminants from the pocket 204 may limit or prevent the formation of undesirable deposits within at least the pocket 204 of the gate valve 200. Reduction or prevention of the undesirable deposits may advantageously prevent the contaminants or deposits from re-entering the process environment upon exhaust therefrom due to deposition and subsequent flaking from gate valve components.

In some embodiments, the gas ports 218 are positioned and the nozzles may be directed to portions of the body 202 which may have inadequate flow from other sources, for example from the vacuum pump 136, to remove contaminants from the body 202. In the exemplary configuration illustrated in FIGS. 1 and 2A and 2B, the gas ports 218 are disposed at locations about the body 202 to urge the contaminants from the body 202 to the opening 206 to be removed from the chamber 110 by the vacuum pump 136.

In operation, the valves 222 provide a flow of fluid or purge gas 221 from the purge gas source 220 to the gas ports 218, via the conduit system 224. The pressure and flow characteristics of the fluid flow may be controlled by mechanisms (not shown) maintaining conditions within the purge gas source 220, the conduit system 224, or the valves 222, or combinations thereof. In some embodiments, the valves 222 provide a constant flow of purge gas 221 to at least some of the gas ports 218 disposed on the body 202.

In other embodiments, one or more of the valves 222 provide a scheduled, or timed, flow of purge gas 221 which may be a part of a cleaning process or recipe that includes specific throttle gate valve movements or positions. For example, in some embodiments, the initiation and the duration of flow, along with other flow characteristics, are coordinated with the position of the gate 214. In some embodiments, the opening and closing of the valves 222 occurs simultaneously, or substantially simultaneously. In other embodiments, the opening and closing of at least some of the valves 222 occurs in a sequential manner, that is some are opened and others are closed in a sequence, depending on process requirements. The valves 222 may be opened in any order, based upon demonstrated effectiveness, or other criteria.

For example, when the gate valve 200 is in the fully open position (FIG. 2A), and before the shutter 216 seals the pocket 204, one or more valves 222 coupled to gas ports 218 disposed about the pocket 204 may open to present a stream of purge gas 221 to the gate 214 and inner surfaces of the pocket 204 to facilitate the removal of contaminants, gases, process byproducts, or other undesirable substances from the gate 214 or the pocket 204. Other valves 222 coupled to other gas ports 218 may be opened to facilitate the removal of similar contaminants from other areas of the gate valve 200. The contaminants may be directed into the opening 206 and included in the waste stream 148 flowing into the vacuum pump 136.

In some embodiments, one or more valves 222 are opened after a prescribed period, for example an idle period of the chamber 110, providing a fluid flow to the body 202. When processing activity, including as a non-limiting example an etch process, is initiated in the etch reactor 100, the valves 222 may be closed to prevent fluid flow into the body 202.

In some embodiments, the opening and closing of the valves 222 may be synchronized with the opening and closing of the gate 214 that is not associated with processing activities in the chamber 110. For example, the gate 214 may repeatedly open or close for the purpose of dislodging contaminants that may have become deposited on portions of the body 202 or the gate 214 after one or more chamber activities have occurred.

In some embodiments, the valves 222 may be open to allow a flow of purge gas 221 to coincide with a chamber cleaning process for cleaning the chamber 110. The purge gas 221 may flow for a predetermined duration of time, or may flow continuously until the next chamber activity is initiated.

Figure 3:
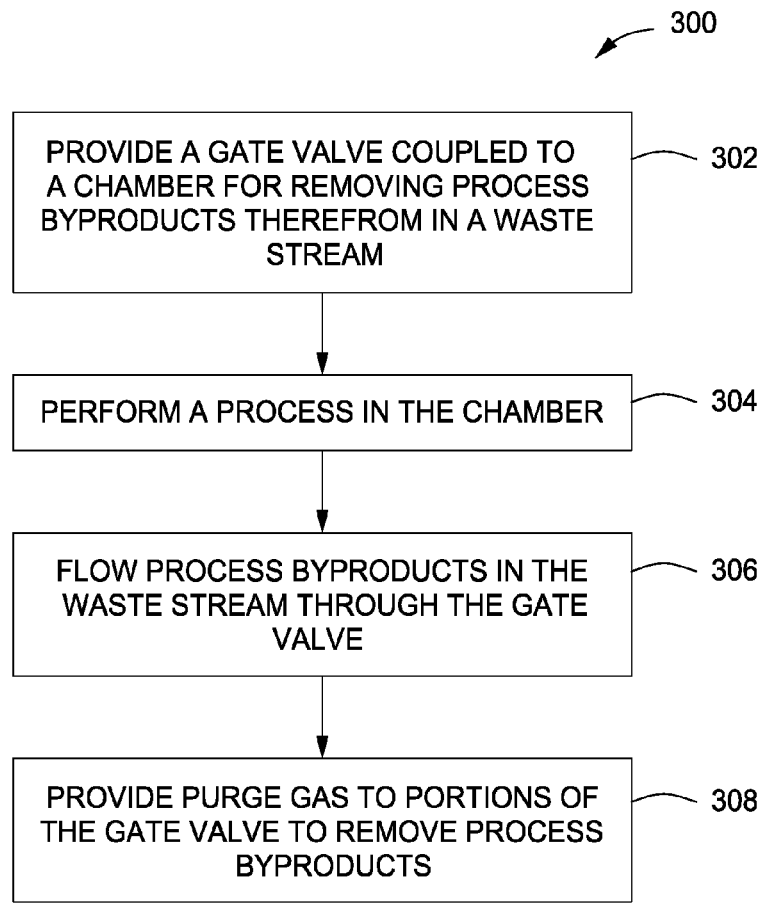
FIG. 3 depicts a flow chart for a method of operating a throttle gate valve in accordance with some embodiments of the present invention.

FIG. 3 depicts a flow chart for a method of removing process byproducts and contaminants from a chamber in accordance with some embodiments of the present invention. The method 300 is described below with respect to FIGS. 1, 2A, and 2B. The method may advantageously limit or prevent contaminant formation and subsequent migration into the process chamber.

The method 300 begins at 302 by providing a chamber 110 having a gate valve, such as the gate valve 200, coupled thereto for removing process byproducts from the inner volume 111 of the chamber 110. The gate valve 200 may be provided in an open position, such that the process environment (e.g., inner volume 111) is fluidly coupled to the vacuum pump 136. As discussed above, in the open position, the gate 214 is disposed in the pocket 204 of the body 202, and the gate 214 and the pocket 204 of the body 202 may be sealed from the opening 206 by the optional shutter 216 (as depicted in FIG. 2A).

At 304, a process may be performed, for example, in the exemplary etch reactor 100, that generates one or more process byproducts to be removed from the inner volume 111. The process may include a plasma etch process, however, other processes that may benefit from the present invention may include any process that may undesirably result in process byproducts and contaminants that may deposit on and/or within components of the gate valve. Non-limiting examples of such processes include chemical vapor deposition, physical vapor deposition, ashing, stripping, or any other deposition or removal process, or the like.

In some embodiments, the process is a plasma etch process that utilizes a plasma (e.g., plasma 155) formed from a process gas (e.g., gaseous mixture 150). The plasma etch process may be utilized to etch, for example, a substrate, such as the substrate 114 disposed substrate support 116.

At 306, the process byproducts may be flowed from the inner volume 111 through the opening 206 in the gate valve 200 and out of the etch reactor 100 via the vacuum pump 136. The process byproducts may include at least one of a reactive species or the process gas or gases, or may comprise a combination of material from the substrate and the process gas or the plasma. The reactive species may include, for example, ions or radials such as those resulting from plasma formation, and further, polymeric species formed from polymerization of radicals. The process gas may include those process gases discussed above, or any process gas uses in the process and not consumed by the plasma.

In some embodiments, at 308, a purge gas, such as a purge gas 221 may be provided to portions of the gate valve 200 via the conduit system 224, valves 222 and gas ports 218. The purge gas 221 may remove at least some process byproducts or other contaminants from portions of the body 202, for example from the surfaces of the pocket 204, the gate 214, or the shutter 216, if present. For example, byproducts and species discussed above, or other such species, may deposit on components of the gate valve 200 during the flow of waste from the chamber 110 through the gate valve 200.

Thus, embodiments of improved gate valves and methods of using the same have been provided herein. The inventive gate valves and methods of using may advantageously prevent or restrict process gases, byproducts, or other such species generated during processing from depositing within a pocket of the gate valve or other components thereof. The inventive method may further advantageously prevent contaminants from entering the process environment due to deposition and subsequent flaking of contaminants on gate valve components.

While the foregoing is directed to embodiments of the present invention, other and further embodiments of the invention may be devised without departing from the basic scope thereof.

The invention claimed is:
1. A gate valve for use in a process chamber, comprising:
   a body having an opening disposed therethrough from a first surface to an opposing second surface of the body;
   a pocket extending into the body from a sidewall of the opening;
   a gate movably disposed within the pocket between a closed position that seals the opening and an open position that reveals the opening and disposes the gate completely within the pocket;
   a recess formed in the body about the opening, the recess providing a receptacle for receiving a shutter;
   the shutter movable between a first position within the recess that allows the gate to freely move, and wherein the shutter is separated from the opening by a portion of the recess, and a second position that seals the pocket when the gate is in the open position; and
   a plurality of gas ports disposed in the gate valve configured to direct a gas flow into a portion of the gate valve fluidly coupled to the opening, wherein a gas port of the plurality of gas ports is disposed in a portion of the recess, the gas port having an external gas supply connection.
2. The gate valve of claim 1, wherein at least some of the gas ports direct a gas flow to the body.

3. The gate valve of claim 1, wherein at least some of the gas ports are disposed in the pocket configured to direct a gas flow to the body.

4. The gate valve of claim 1, wherein at least some of the gas ports direct a gas flow to the gate.

5. The gate valve of claim 1, wherein at least some of the gas ports comprise gas diffusers.

6. The gate valve of claim 1, further comprising one or more valves coupled to the gas ports to selectively open or close the gas ports.

7. The gate valve of claim 6, wherein the one or more valves comprise mass flow controllers.

8. The gate valve of claim 6, wherein one or more of the valves are controlled by an actuator.

9. The gate valve of claim 8, wherein the actuator is a pneumatic actuator.

10. The gate valve of claim 8, wherein the actuator is a servo motor.

11. The gate valve of claim 1, further comprising:
a process chamber coupled to the first surface, the process chamber having an inner volume for holding a substrate therein during processing.

12. The gate valve of claim 11, wherein at least some of the gas ports direct a gas flow to the body.

13. The gate valve of claim 11, wherein at least some of the gas ports are disposed in the pocket configured to direct a gas flow to the body.

14. The gate valve of claim 11, further comprising one or more valves coupled to the gas ports to selectively open or close the gas ports, wherein one or more of the valves are controlled by an actuator.

15. The gate valve of claim 14, wherein the actuator is one of a pneumatic actuator or a servo motor.

16. The gate valve of claim 11, further comprising:
one or more valves coupled to the gas ports to selectively open or close the gas ports; and
one or more gas supplies fluidly coupled to the one or more valves.

17. The gate valve of claim 16, wherein one or more of the gas supplies comprise an inert gas.

18. The gate valve of claim 17, wherein one or more of the inert gas supplies comprise nitrogen.

19. The gate valve of claim 1, wherein at least one of the plurality of gas ports has a nozzle which is positionable in relation to a body of the at least one of the plurality of gas ports.

20. A gate valve for use in a process chamber, comprising:
a body having an opening disposed therethrough from a first surface to an opposing second surface of the body;
a pocket extending into the body from a sidewall of the opening;
a gate movably disposed within the pocket between a closed position that seals the opening and an open position that reveals the opening and disposes the gate completely within the pocket;
a recess formed in the body about the opening, the recess having at least one gas port;
a shutter movable between a first position within the recess that allows the gate to freely move, and wherein the shutter is separated from the opening by a portion of the recess, and a second position that seals the pocket when the gate is in the open position;
a plurality of gas ports disposed in the pocket configured to direct a gas flow into a portion of the gate valve fluidly coupled to the opening, wherein a gas port of the plurality of gas ports is disposed through a sidewall of the opening in a portion of the pocket facing a sidewall of the gate when the gate is in the closed position such that the gas flow is directed at the sidewall of the gate; and
one or more valves coupled to the gas ports to selectively open or close the gas ports.

* * * * *

UNITED STATES PATENT AND TRADEMARK OFFICE
CERTIFICATE OF CORRECTION

PATENT NO. : 10,010,912 B2
APPLICATION NO. : 14/276289
DATED : July 3, 2018
INVENTOR(S) : Lee et al.

Page 1 of 1

It is certified that error appears in the above-identified patent and that said Letters Patent is hereby corrected as shown below:

In the Specification

In Column 1, Line 8, delete "Jun.14, 2014" and substitute therefor --Jun. 14, 2013--.

Signed and Sealed this
Twenty-second Day of January, 2019

Andrei Iancu
*Director of the United States Patent and Trademark Office*